(12) United States Patent
Sakaguchi et al.

(10) Patent No.: US 10,985,416 B2
(45) Date of Patent: Apr. 20, 2021

(54) THERMAL CONDUCTION SHEET AND SECONDARY BATTERY PACK USING SAME

(71) Applicant: Panasonic Intellectual Property Management Co., Ltd., Osaka (JP)

(72) Inventors: Yoshiya Sakaguchi, Kyoto (JP); Takeshi Fujii, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 153 days.

(21) Appl. No.: 16/303,672

(22) PCT Filed: Jun. 16, 2017

(86) PCT No.: PCT/JP2017/022305
§ 371 (c)(1),
(2) Date: Nov. 21, 2018

(87) PCT Pub. No.: WO2018/003547
PCT Pub. Date: Jan. 4, 2018

(65) Prior Publication Data
US 2019/0372181 A1    Dec. 5, 2019

(30) Foreign Application Priority Data
Jul. 1, 2016    (JP) .............................. JP2016-131181

(51) Int. Cl.
*H01M 10/653*    (2014.01)
*H01M 10/652*    (2014.01)
(Continued)

(52) U.S. Cl.
CPC ....... *H01M 10/653* (2015.04); *H01M 10/652* (2015.04); *H01M 10/655* (2015.04); *H01M 50/10* (2021.01)

(58) Field of Classification Search
CPC ......... B32B 9/00; H01L 23/36; H01L 23/373; H01M 10/652; H01M 10/653;
(Continued)

(56) References Cited

U.S. PATENT DOCUMENTS

2012/0009455 A1    1/2012    Yoon
2017/0110385 A1    4/2017    Kawajiri et al.

FOREIGN PATENT DOCUMENTS

| JP | 55-022468 | 2/1980 |
| JP | 2012-018915 | 1/2012 |

(Continued)

OTHER PUBLICATIONS

International Search Report of PCT application No. PCT/JP2017/022305 dated Jul. 11, 2017.

*Primary Examiner* — Adam A Arciero
(74) *Attorney, Agent, or Firm* — McDermott Will and Emery LLP

(57) ABSTRACT

Provided is a thermal conduction sheet that is easily attached from one face to the other face of a battery cell, the faces being perpendicular to each other. Thermal conduction sheet includes graphite sheet, and insulating sheets between and with which graphite sheet is entirely sandwiched and sealed. Graphite sheet has a plurality of cut-out portions arranged linearly. Thermal conduction sheet is bent at a region where cut-out portions are formed. Thus, thermal conduction sheet is attached from one face to the other face of a battery cell, the faces being perpendicular to each other.

4 Claims, 17 Drawing Sheets

(51) Int. Cl.
*H01M 10/655* (2014.01)
*H01M 50/10* (2021.01)

(58) Field of Classification Search
CPC .. H01M 10/655; H01M 10/6555; H01M 2/02; H01M 2/0237; H05K 7/20
See application file for complete search history.

(56) References Cited

FOREIGN PATENT DOCUMENTS

| | | |
|---|---|---|
| JP | 2015-071727 | 4/2015 |
| JP | 2015-193391 | 11/2015 |
| WO | 2015/155940 | 10/2015 |

THERMAL CONDUCTION SHEET AND SECONDARY BATTERY PACK USING SAME

CROSS-REFERENCE TO RELATED APPLICATIONS

This application is a U.S. national stage application of the PCT International Application No. PCT/JP2017/022305 filed on Jun. 16, 2017, which claims the benefit of foreign priority of Japanese patent application 2016-131181 filed on Jul. 1, 2016, the contents all of which are incorporated herein by reference.

FIELD OF THE INVENTION

The present disclosure relates to a thermal conduction sheet for use in, for example, a lithium-ion secondary battery, and a battery pack including the thermal conduction sheet.

DESCRIPTION OF THE RELATED ART

Various devices have been equipped with a lithium-ion secondary battery of which the current capacity has been increased. With the increase of the current capacity, countermeasures against heat from the lithium-ion secondary battery have been increasingly required. Typically, a lithium-ion secondary battery is used as a battery module including a plurality of battery cells connected to one another. When a difference in temperature inside the battery cells of the lithium-ion secondary battery increases or when a difference in temperature among the plurality of battery cells increases, the lithium-ion secondary battery is apt to be degraded. Hence, countermeasures against thermal equalization among the battery cells are required for protection of the lithium-ion secondary battery from degradation. In many techniques, a thermal conductor is disposed in a battery module to achieve thermal equalization among battery cells. A graphite sheet is used as the thermal conductor.

For example, Patent Literature 1 is known as a cited reference related to the technique described above.

CITATION LIST

Patent Literature

PTL 1: Unexamined Japanese Patent Publication No. 2015-71727

SUMMARY OF THE INVENTION

In cases of using a thermal conductor, desirably, the thermal conductor has on its face an adhesive adhering to a thermal generation unit such that the thermal conductor comes into contact with the thermal generation unit without clearance to enable efficient thermal conduction. In cases of using a thermal conductor for a small electronic device such as a mobile phone, a graphite sheet is small in size, and therefore is attached without a problem. In cases of attaching a thermal conductor to a large device such as an on-vehicle battery cell, however, a thermal conductor including a large-area graphite sheet needs to be used. Attachment of a thermal conduction sheet to a side face of largest area of a battery cell can be effective for achieving thermal equalization among battery cells. In order to reduce a temperature of each battery cell, desirably, a thermal conduction sheet is extended from the side face of the battery cell to a face that is in contact with a housing, e.g., a bottom face of the battery cell. A graphite sheet has conductivity. Thus, the following graphite sheet has been typically used as a thermal conduction sheet. That is, the graphite sheet has both faces to which insulating sheets are attached. The graphite sheet having on its both faces the insulating sheets is less prone to being bent. Consequently, the graphite sheet is not smoothly attached from one face to the other face of a battery cell, the faces being perpendicular to each other, since the graphite sheet can swell out at a corner of the battery cell.

As a solution to the problem above, the present disclosure provides a thermal conduction sheet including a graphite sheet, and insulating sheets between and with which the graphite sheet is entirely sandwiched and sealed. The graphite sheet has a plurality of cut-out portions arranged linearly.

With this configuration, the thermal conduction sheet is easily bent at a region where the cut-out portions are formed, so that the thermal conduction sheet is easily attached from a side face to a bottom face of a battery cell.

DETAILED DESCRIPTION OF THE PREFERRED EMBODIMENTS

First Exemplary Embodiment

A thermal conduction sheet according to a first exemplary embodiment of the present disclosure will be described below with reference to the drawings.

Figure 1:
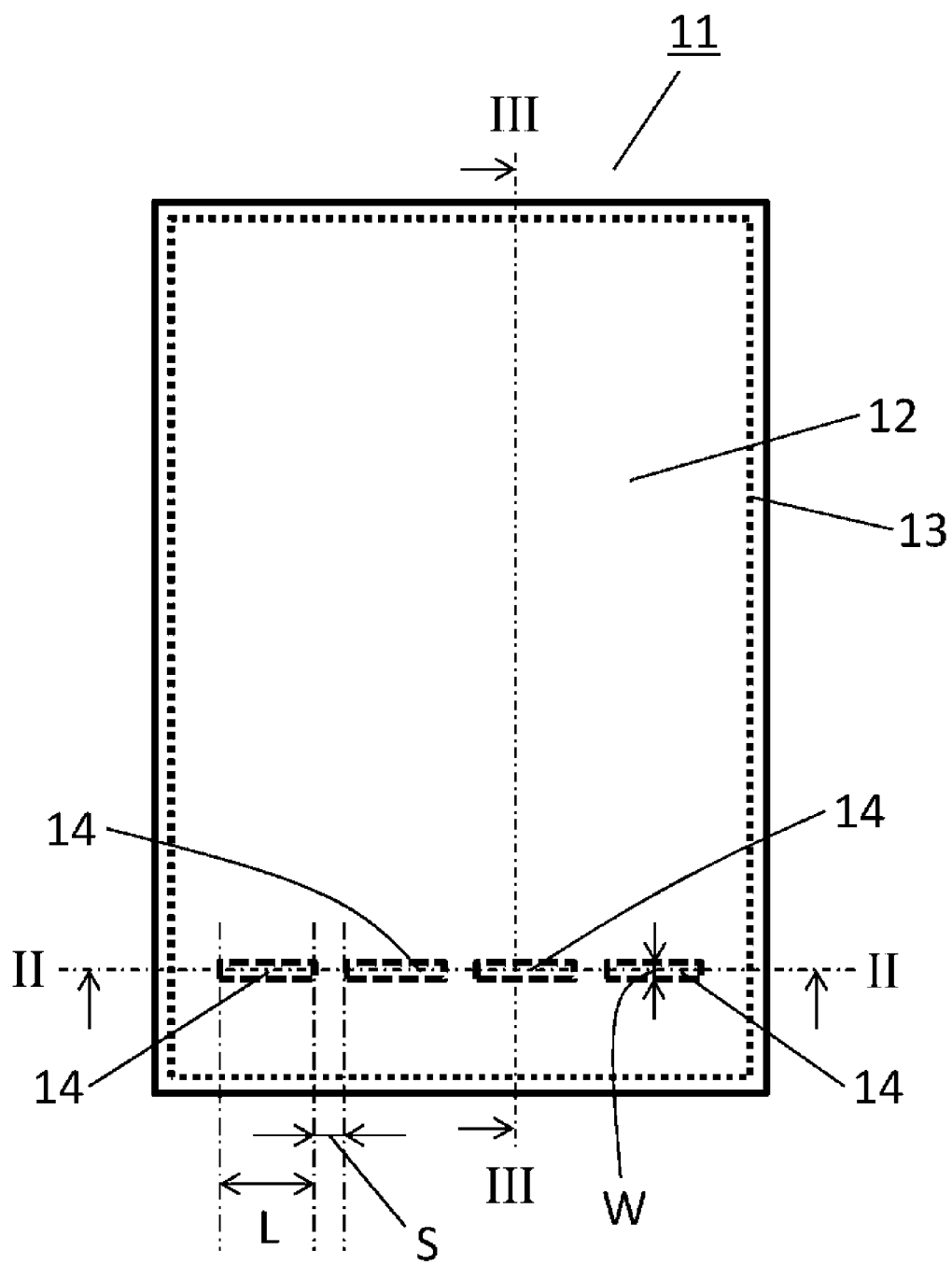
FIG. 1 is a top view of a thermal conduction sheet according to a first exemplary embodiment of the present disclosure.
Figure 2:
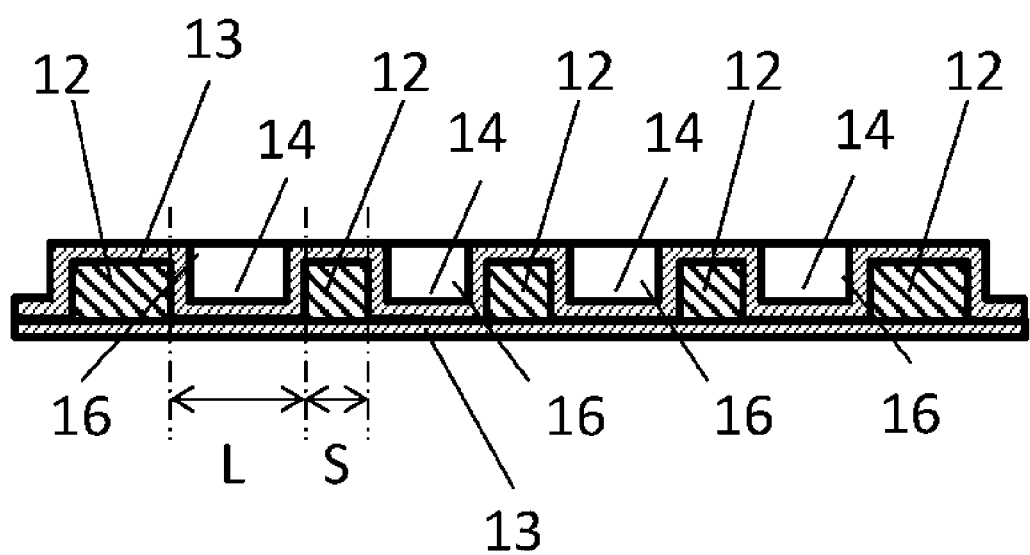
FIG. 2 is a cross-sectional view of the thermal conduction sheet, taken along line II-II in FIG. 1.
Figure 3:
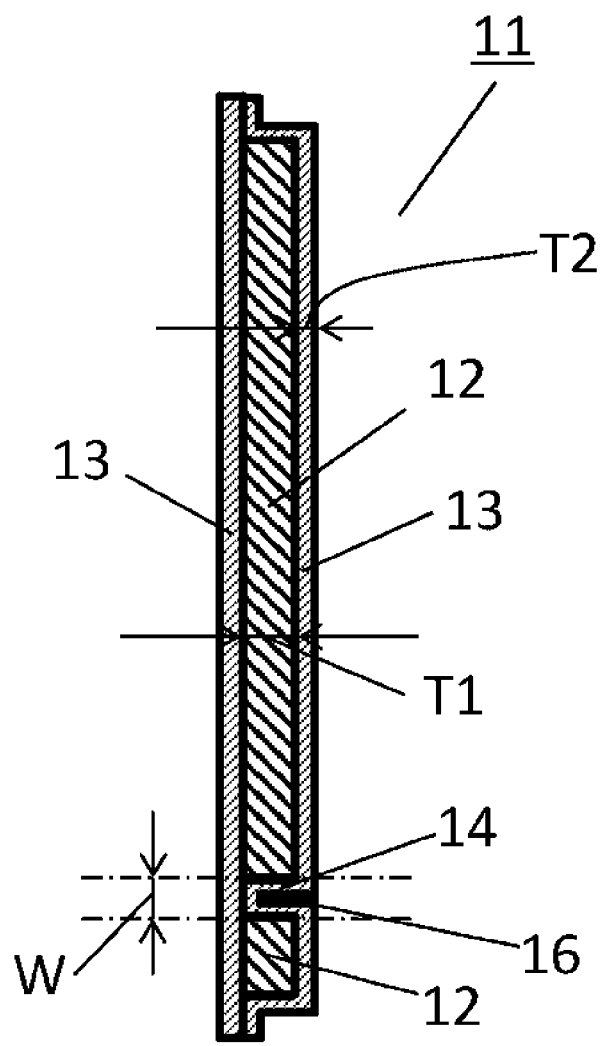
FIG. 3 is a cross-sectional view of the thermal conduction sheet, taken along line III-III in FIG. 1.

FIG. 1 is a top view of thermal conduction sheet 11 according to the first exemplary embodiment of the present disclosure. FIG. 2 is a cross-sectional view of thermal conduction sheet 11 in FIG. 1. The cross-sectional view is taken along a plane perpendicular to a main surface of thermal conduction sheet 11 including line II-II in FIG. 1. FIG. 3 is a cross-sectional view of thermal conduction sheet 11 in FIG. 1. The cross-sectional view is taken along a plane perpendicular to the main surface of thermal conduction sheet 11 including line III-III in FIG. 1. Line II-II covers a plurality of cut-out portions 14 and extends in a direction in which cut-out portions 14 are arranged. Line III-III passes through one of cut-out portions 14 and extends in a direction perpendicular to line II-II.

Thermal conduction sheet 11 includes graphite sheet 12, and insulating sheets 13 respectively attached to both faces of graphite sheet 12. Graphite sheet 12 has a thickness of approximately 50 μm. Each of insulating sheets 13 has a thickness of approximately 10 μm, and is made of, for example, a polyethylene terephthalate (hereinafter, referred to as PET). Each of insulating sheets 13 has, on its face disposed opposite graphite sheet 12, an adhesive (not shown) such as an acrylic resin. Insulating sheets 13 and graphite sheet 12 respectively have a rectangular shape. Insulating sheets 13 are larger in shape than graphite sheet 12. Each of insulating sheets 13 has an end that is out of contact with graphite sheet 12. When these ends of insulating sheets 13 are bonded with the adhesive, graphite sheet 12 is sealed with insulating sheets 13. Graphite sheet 12 is formed of, for example, a thermally decomposed polymer film.

Graphite sheet 12 has a plurality of cut-out portions 14 arranged linearly. Each of cut-out portions 14 has a rectangular shape and passes through graphite sheet 12. Graphite sheet 12 satisfies relationships of L=10 mm and S=5 mm, where L represents a length of each cut-out portion 14 in a direction in which cut-out portions 14 are arranged, and S represents a length between adjoining two of cut-out portions 14. Insulating sheets 13 are bonded with the adhesive inside cut-out portions 14. One of insulating sheets 13 bonded together has recesses 16 formed in correspondence with cut-out portions 14.

According to the present exemplary embodiment, thermal conduction sheet 11 including graphite sheet 12 having the plurality of cut-out portions 14 arranged linearly, and insulating sheets 13 attached to both the faces of graphite sheet 12 is easily bent along the line in which the cut-out portions 14 are arranged. Accordingly, thermal conduction sheet 11 is easily attached to, for example, a battery cell. Graphite sheet 12 is excellent in thermal conductivity in a through-plane direction, and therefore sufficiently transfers heat at a portion other than cut-out portions 14 even when cut-out portions 14 are formed. Graphite sheet 12 when being attached to a battery cell therefore transfers heat from a side face to a bottom face of the battery cell, and dissipates the heat through a housing.

The relationship between L (L: the length of each cut-out portion 14) and S (S: the length between adjoining two of cut-out portions 14) is desirably expressed by Mathematical Formula 1.

[Mathematical Formula 1]

$$0.5 \leq \frac{L}{L+S} \leq 0.9 \quad (1)$$

The reason therefor is as follows. L/(L+S) that is smaller than 0.5 can deteriorate the bending performance of thermal conduction sheet 11. Conversely, L/(L+S) that is larger than 0.9 can hinder the thermal conductivity of thermal conduction sheet 11.

Further, a relationship among W (W: a width of each cut-out portion 14 in the direction perpendicular to the direction in which cut-out portions 14 are arranged), T1 (T1: a thickness of graphite sheet 12), and T2 (T2: a thickness of each insulating sheet 13) is preferably expressed by Mathematical Formula 2.

[Mathematical Formula 2]

$$2 \cdot (T1+2 \cdot T2) \leq W \leq 10 \cdot (T1+2 \cdot T2) \quad (2)$$

The reason therefor is as follows. W that is smaller than 2·(T1+2·T2) can make thermal conduction sheet 11 less prone to being bent. On the other hand, W that is larger than 10·(T1+2·T2) can make the strength of thermal conduction sheet 11 degraded, and hinder the thermal conductivity of thermal conduction sheet 11. With regard to thermal conduction sheet 11, T1 is nearly equal to 50 μm, and T2 is nearly equal to 10 μm.

Figure 4:
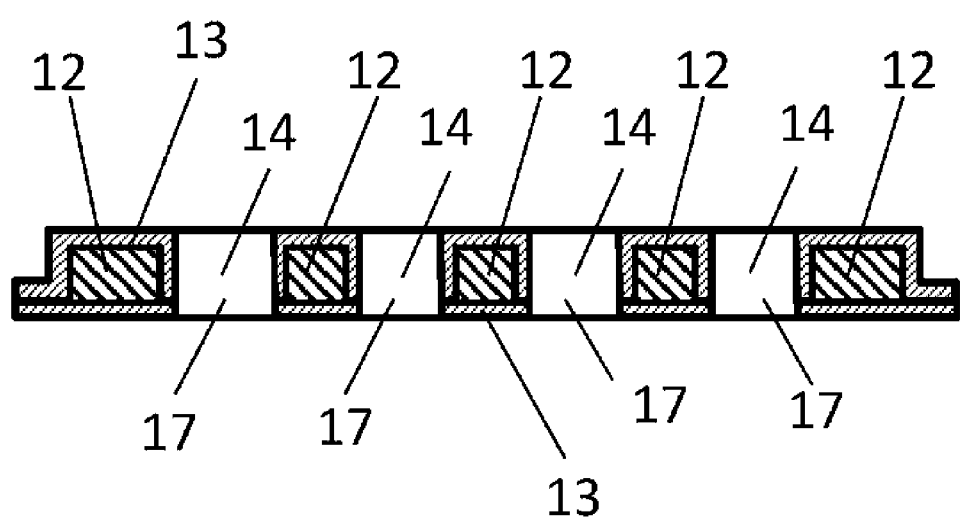
FIG. 4 is a cross-sectional view of a preferred example of the thermal conduction sheet.

As illustrated in FIG. 2, insulating sheets 13 are desirably bonded together inside cut-out portions 14. Further, as illustrated in FIG. 4, insulating sheets 13 inside cut-out portions 14 preferably have through holes 17 instead of recesses 16. With through holes 17, even when air inclusion occurs in, for example, attaching thermal conduction sheet 11 to a battery cell, the air is released from through holes 17, so that the thermal conduction sheet is brought into contact with the battery cell without clearance. FIG. 4 is a cross-sectional view corresponding to the cross-sectional view of FIG. 2.

The shape of thermal conduction sheet 11 at each cut-out portion 14 and its vicinity as seen in cross-sectional view may be those in a first modification, a second modification, a third modification, and a fourth modification to be described later. The shape of thermal conduction sheet 11 at each cut-out portion 14 and its vicinity as seen in top view may be those in a fifth modification, a sixth modification, and a seventh modification to be described later.

(First Modification)

Figure 5A:
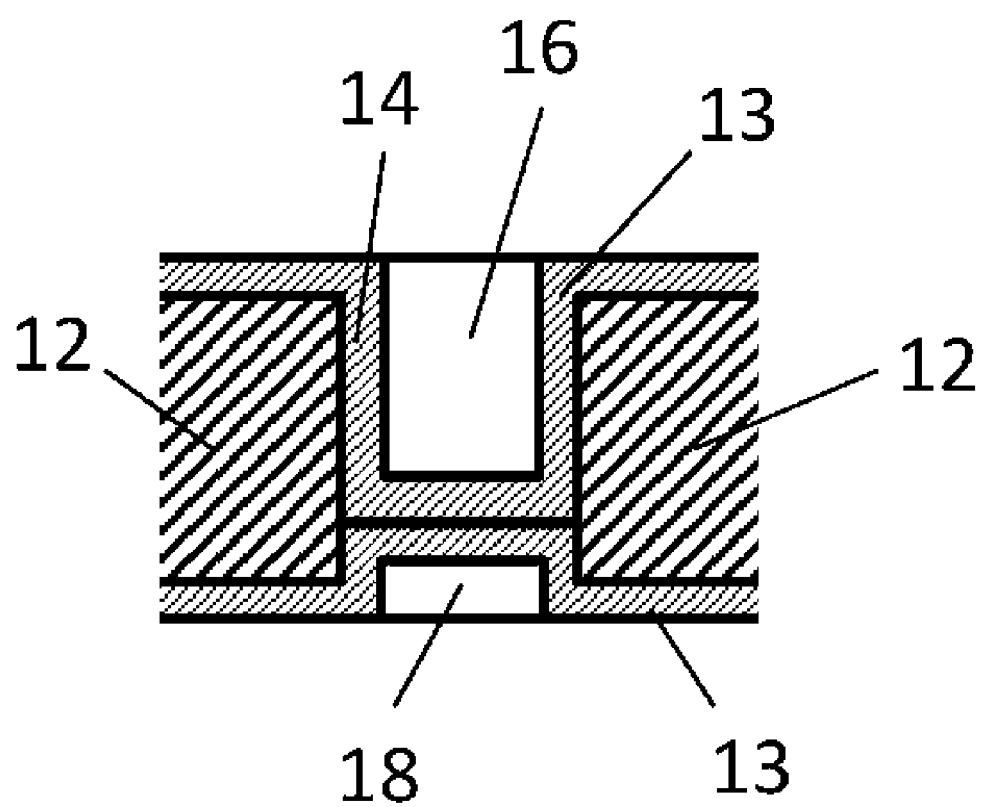
FIG. 5A is a partial cross-sectional view of a thermal conduction sheet according to a first modification of the first exemplary embodiment.

A shape illustrated in FIG. 5A is applicable as a shape of thermal conduction sheet 11 according to a first modification at each cut-out portion 14 and its vicinity as seen in cross-sectional view. In FIG. 5A, the other one of two insulating sheets 13 bonded together has a dent 18 formed in correspondence with cut-out portion 14. The other constituent elements are similar to those illustrated in FIG. 2.

(Second Modification)

Figure 5B:
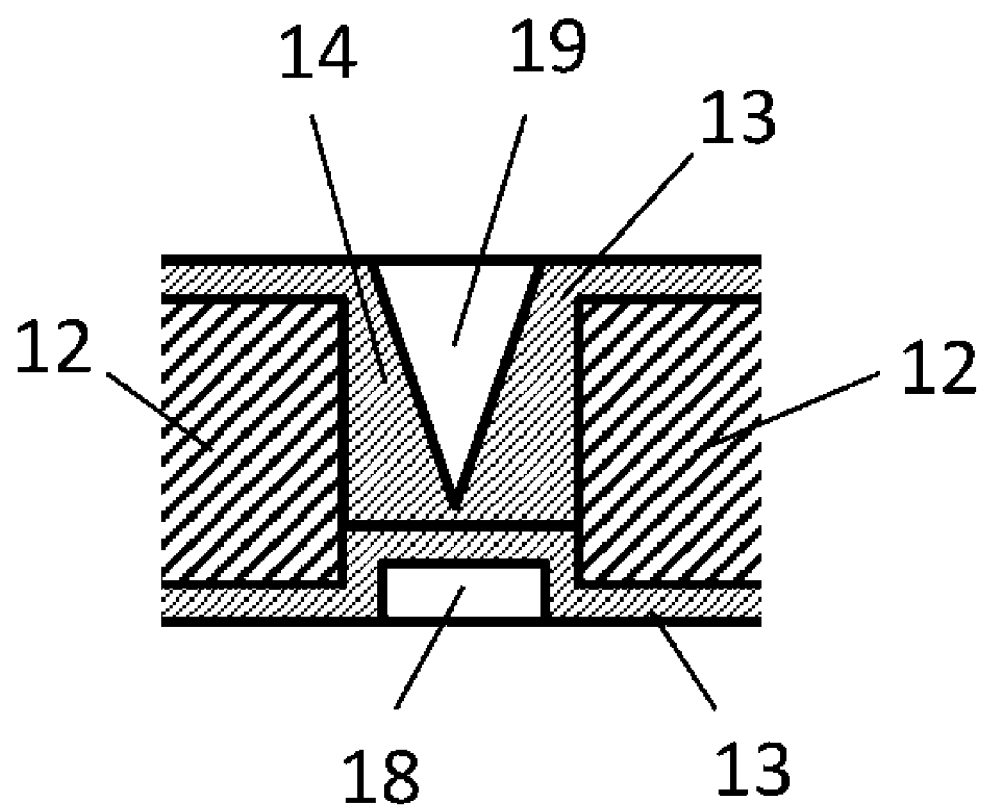
FIG. 5B is a partial cross-sectional view of a thermal conduction sheet according to a second modification of the first exemplary embodiment.

A shape illustrated in FIG. 5B is applicable as a shape of thermal conduction sheet 11 according to a second modification at each cut-out portion 14 and its vicinity as seen in cross-sectional view. In FIG. 5B, one of two insulating sheets 13 bonded together has a triangular groove 19 formed in correspondence with cut-out portion 14.

The other one of insulating sheets 13 may be formed in a flat shape without dent 18 to be formed in correspondence with cut-out portion 14.

In addition, triangular groove 19 may pass through insulating sheet 13. In this case, even when air inclusion occurs in, for example, attaching thermal conduction sheet 11 to the battery cell, the air is released from triangular groove 19, so that thermal conduction sheet 11 is brought into contact with the battery cell without clearance.

(Third Modification)

Figure 5C:
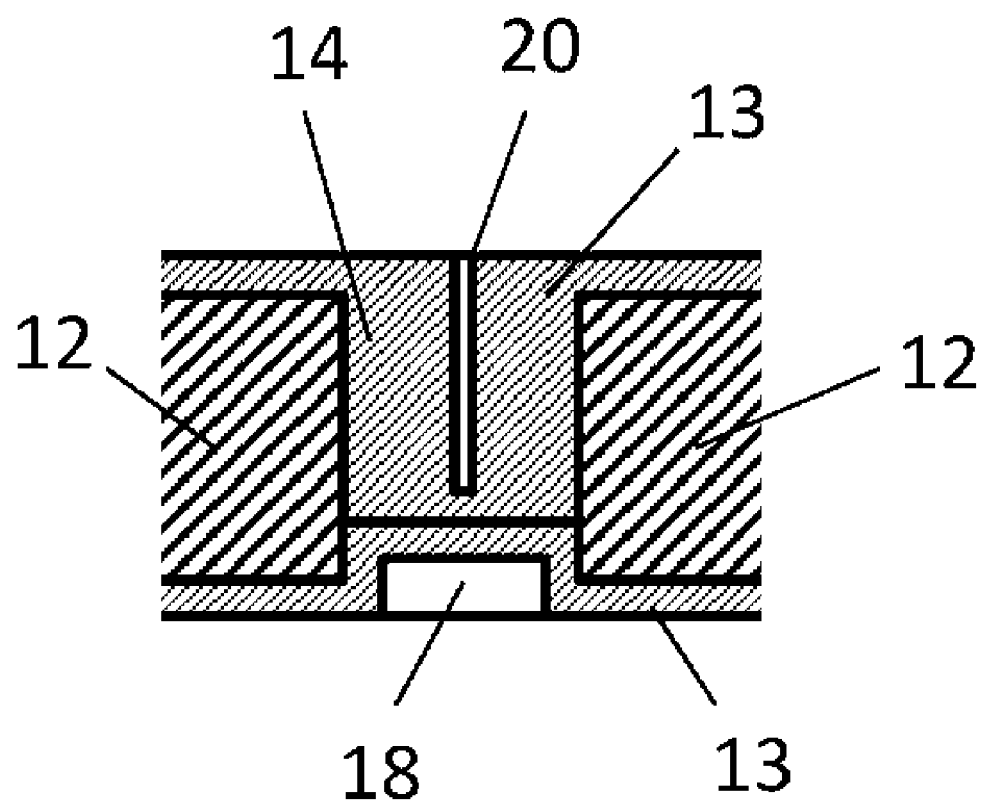
FIG. 5C is a partial cross-sectional view of a thermal conduction sheet according to a third modification of the first exemplary embodiment.

A shape illustrated in FIG. 5C is applicable as a shape of thermal conduction sheet 11 according to a third modification at each cut-out portion 14 and its vicinity as seen in cross-sectional view. In FIG. 5C, one of two insulating sheets 13 bonded together has a slit 20 formed in correspondence with cut-out portion 14. Slit 20 is formed by making a cut into insulating sheet 13.

The other one of insulating sheets 13 may be formed in a flat shape without dent 18 to be formed in correspondence with cut-out portion 14.

(Fourth Modification)

Figure 5D:
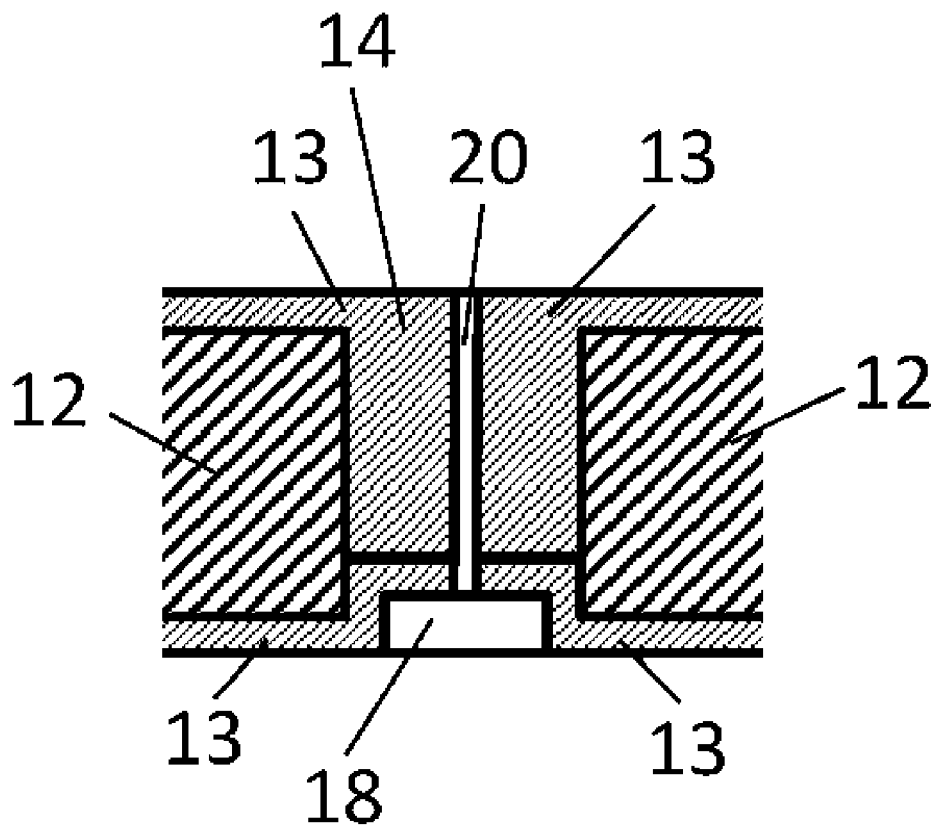
FIG. 5D is a partial cross-sectional view of a thermal conduction sheet according to a fourth modification of the first exemplary embodiment.

A shape illustrated in FIG. 5D is applicable as a shape of thermal conduction sheet 11 according to a fourth modification at each cut-out portion 14 and its vicinity as seen in cross-sectional view. In FIG. 5D, slit 20 in FIG. 5C passes through insulating sheet 13. In this case, even when air inclusion occurs in, for example, attaching thermal conduction sheet 11 to the battery cell, the air is released from slit 20, so that thermal conduction sheet 11 is brought into contact with the battery cell without clearance.

The other one of insulating sheets 13 may be formed in a flat shape without dent 18 to be formed in correspondence with cut-out portion 14.

(Fifth Modification)

Figure 6A:
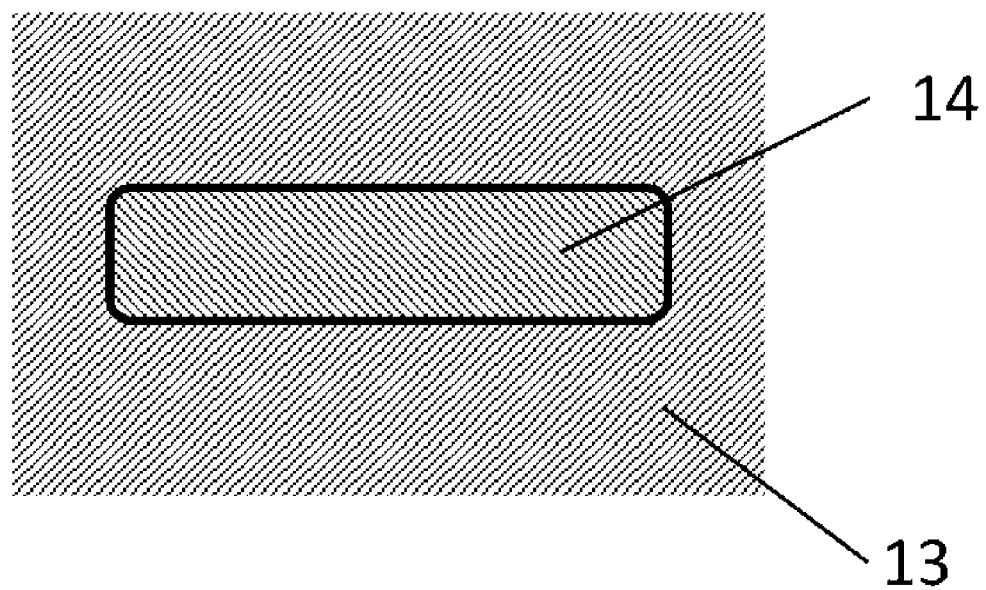
FIG. 6A is a partial top view of a thermal conduction sheet according to a fifth modification of the first exemplary embodiment.

A shape illustrated in FIG. 6A is applicable as a shape of thermal conduction sheet 11 according to a fifth modification at each cut-out portion 14 and its vicinity as seen in plan view. In FIG. 6A, cut-out portion 14 has rounded corners.

(Sixth Modification)

Figure 6B:
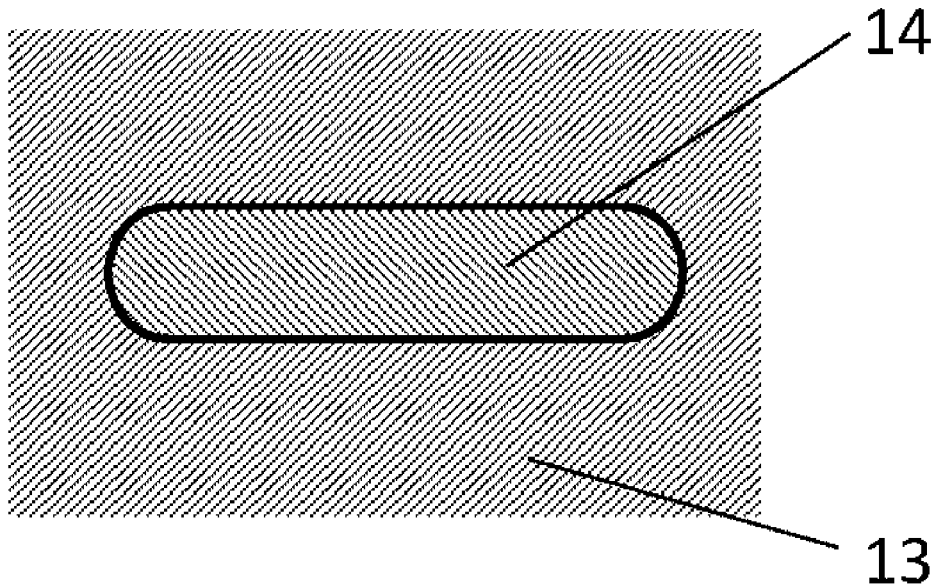
FIG. 6B is a partial top view of a thermal conduction sheet according to a sixth modification of the first exemplary embodiment.

A shape illustrated in FIG. 6B is applicable as a shape of thermal conduction sheet 11 according to a sixth modification at each cut-out portion 14 and its vicinity as seen in plan view. In FIG. 6B, cut-out portion 14 has semicircular ends.

(Seventh Modification)

Figure 6C:
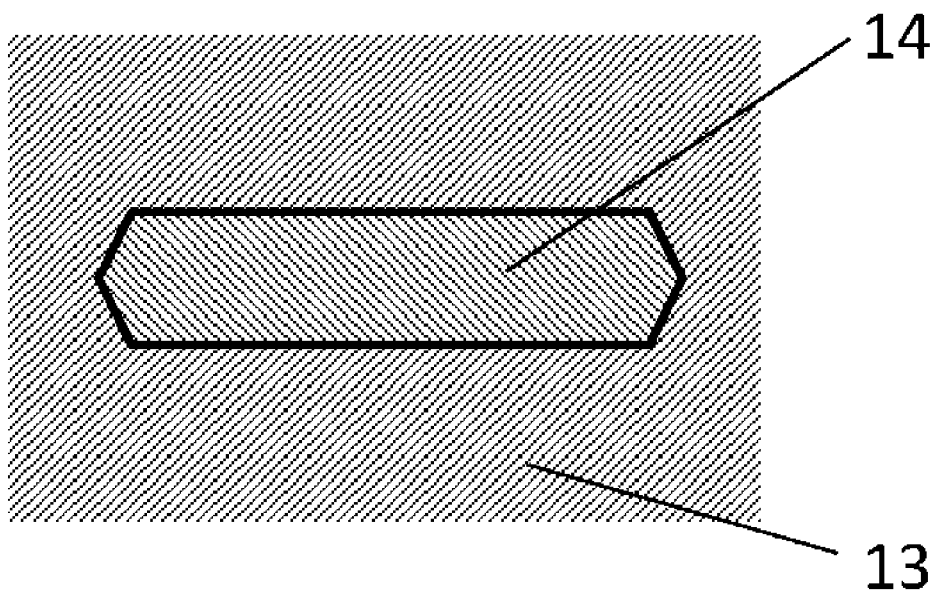
FIG. 6C is a partial top view of a thermal conduction sheet according to a seventh modification of the first exemplary embodiment.

A shape illustrated in FIG. 6C is applicable as a shape of thermal conduction sheet 11 according to a seventh modification at each cut-out portion 14 and its vicinity as seen in plan view. In FIG. 6C, cut-out portion 14 has angular ends.

The angular ends of cut-out portion 14 may be formed in various shapes in addition to the shapes illustrated in FIG. 6C.

Second Exemplary Embodiment

Next, a battery pack including the thermal conduction sheet described in the first exemplary embodiment of the present disclosure will be described.

Figure 7:
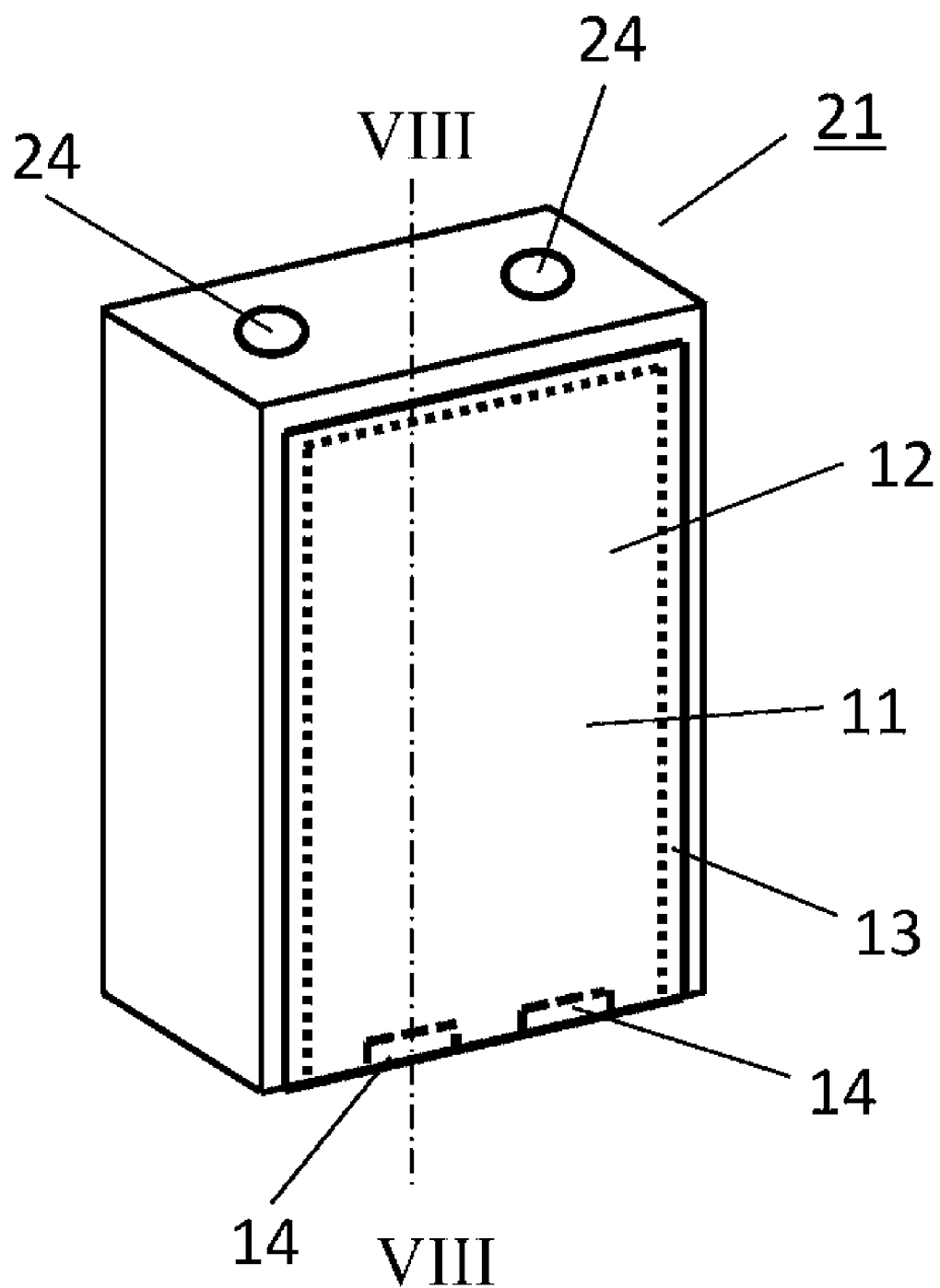
FIG. 7 is a perspective view of a battery cell according to a second exemplary embodiment of the present disclosure.
Figure 8:
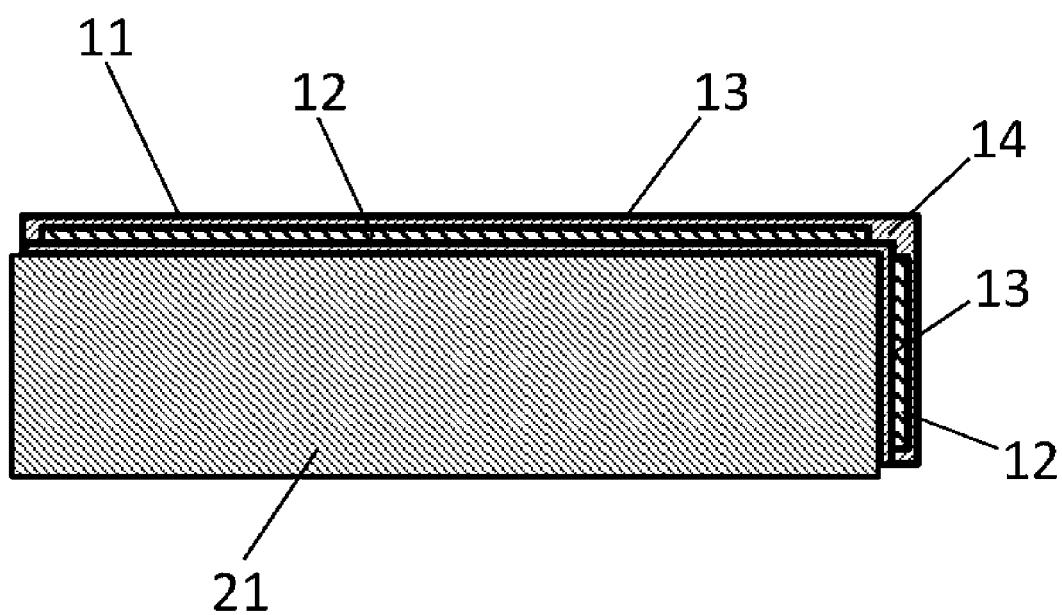
FIG. 8 is a cross-sectional view of the battery cell, taken along line VIII-VIII in FIG. 7.
Figure 9:
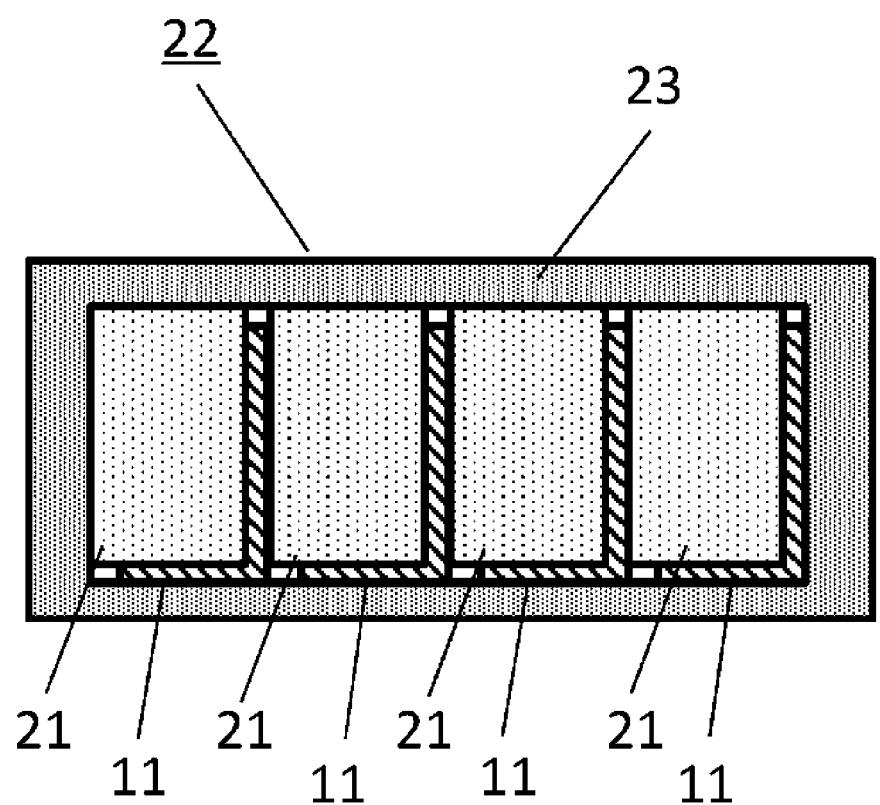
FIG. 9 is a schematic diagram of a battery pack according to the second exemplary embodiment of the present disclosure.

FIG. 7 is a perspective view of battery cell 21 as a secondary battery including thermal conduction sheet 11 according to the first exemplary embodiment. FIG. 8 is a cross-sectional view of battery cell 21 in FIG. 7. The cross-sectional view is taken along a plane perpendicular to a main surface of thermal conduction sheet 11 including line VIII-VIII in FIG. 7. Line VIII-VIII in FIG. 7 is a line segment along a longitudinal direction of thermal conduction sheet 11. FIG. 9 is a schematic diagram of battery pack 22 including a plurality of battery cells 21 illustrated in FIG. 8.

Battery pack 22 includes housing 23 made of metal, and the plurality of battery cells 21 arranged in and fixed to housing 23. Each battery cell 21 has a width of approximately 150 mm, a height of approximately 100 mm, and a thickness of approximately 20 mm Thermal conduction sheet 11 is attached to each of battery cells 21. Each battery cell 21 is a square lithium-ion battery and has, on its upper face, terminal electrodes 24. Thermal conduction sheet 11 is attached from one side face to a bottom face of a corresponding one of battery cells 21. The bottom face of each battery cell 21 is in contact with housing 23, with corresponding thermal conduction sheet 11 interposed between the bottom face and housing 23.

Thermal conduction sheet 11 includes graphite sheet 12, and insulating sheets 13 between and with which graphite sheet 12 is entirely sandwiched and sealed. Graphite sheet 12 has the plurality of cut-out portions 14 arranged linearly, and thermal conduction sheet 11 is bent at the portion where cut-out portions 14 are arranged. Thermal conduction sheet 11 is attached to corresponding battery cell 21 such that the portion at which thermal conduction sheet 11 is bent is aligned with a boundary (a corner) between the side face and the bottom face of battery cell 21. With this configuration, thermal conduction sheet 11 is easily bent at a region where cut-out portions 14 are formed, and is easily attached from the side face to the bottom face of battery cell 21. This configuration enables a reduction in temperature distribution in battery cell 21, and also enables a reduction in temperature of entire battery cell 21 by heat dissipation from the bottom face of battery cell 21 to housing 23.

Alternatively, thermal conduction sheet 11 may be attached from one side face to the bottom face, and further to the other side face of battery cell 21. This configuration enables a further reduction in temperature distribution in battery cell 21.

In the first and second exemplary embodiments, thermal conduction sheet 11 has a rectangular shape; however, the shape is not limited to the rectangular shape. Thermal conduction sheet 11 may alternatively be formed in a polygonal shape such as a triangular shape or a hexagonal shape, a circular shape, an elliptical shape, or a sector shape in accordance with a shape of battery cell 21.

In the second exemplary embodiment, battery cell 21 has been described as an example of a thermal generation unit. Alternatively, the thermal generation unit may be any element, in addition to battery cell 21.

Third Exemplary Embodiment

Next, a thermal conduction sheet according to a third exemplary embodiment of the present disclosure and a battery pack including the thermal conduction sheet will be described.

Figure 10:
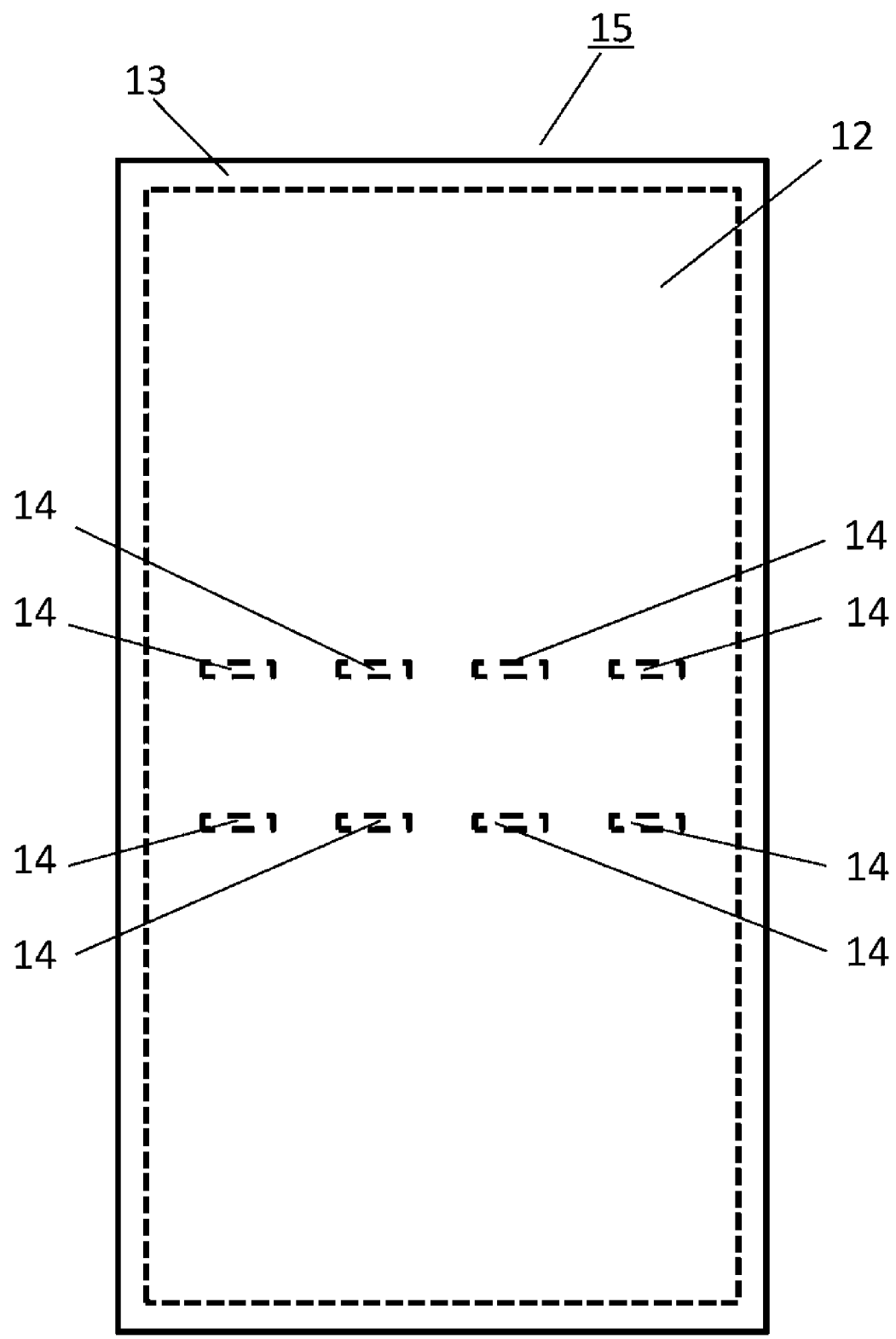
FIG. 10 is a top view of a thermal conduction sheet according to a third exemplary embodiment of the present disclosure.

FIG. 10 is a top view of thermal conduction sheet 15 according to the third exemplary embodiment of the present disclosure. Thermal conduction sheet 15 differs from thermal conduction sheet 11 according to the first exemplary embodiment in that cut-out portions 14 are arranged in two rows. Cut-out portions 14 are arranged in correspondence with lower corners of battery cell 21, as will be described below. Thermal conduction sheet 15 is similar in material and cross-sectional structure to thermal conduction sheet 11 described in the first exemplary embodiment. Thermal conduction sheet 15 is attached from one side face to a bottom face, and further to the other side face of battery cell 21. This configuration enables a further reduction in temperature distribution in battery cell 21.

Figure 11:
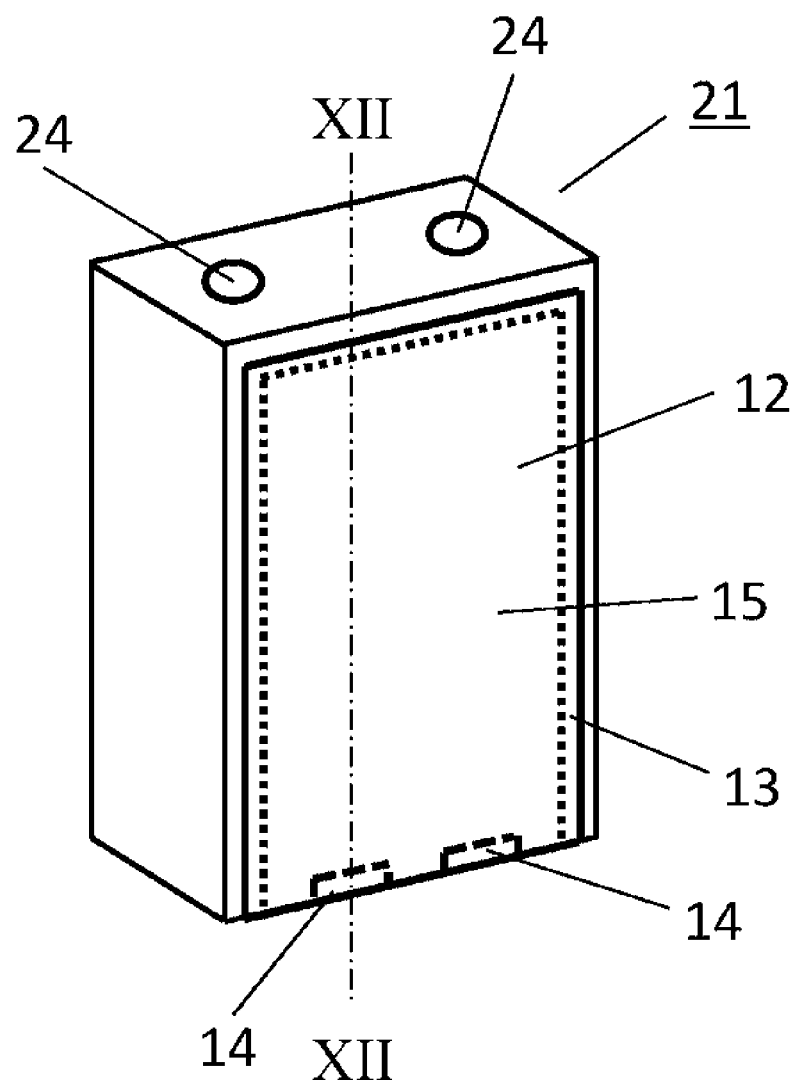
FIG. 11 is a perspective view of a battery cell according to the third exemplary embodiment of the present disclosure.
Figure 12:
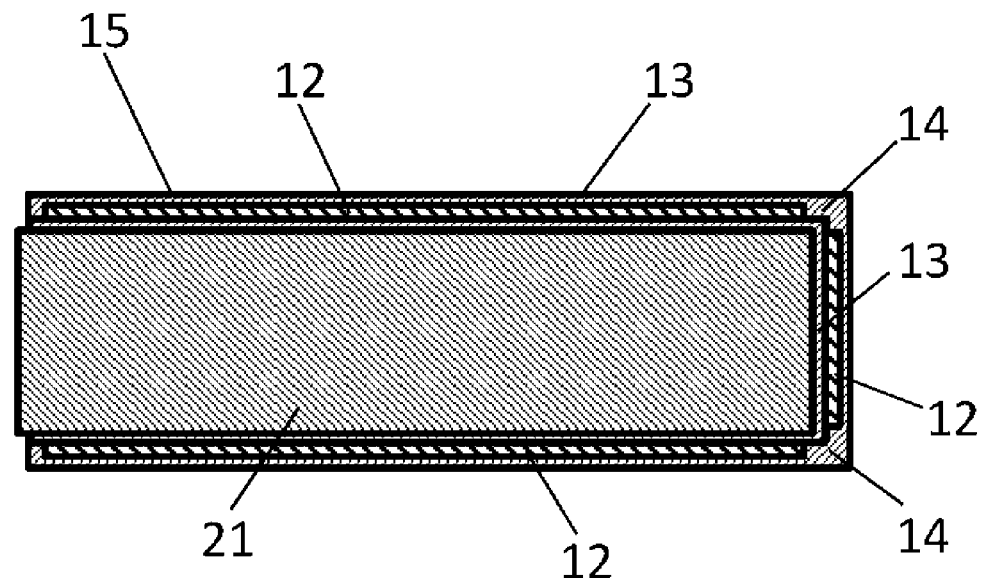
FIG. 12 is a cross-sectional view of the battery cell, taken along line XII-XII in FIG. 11.
Figure 13:
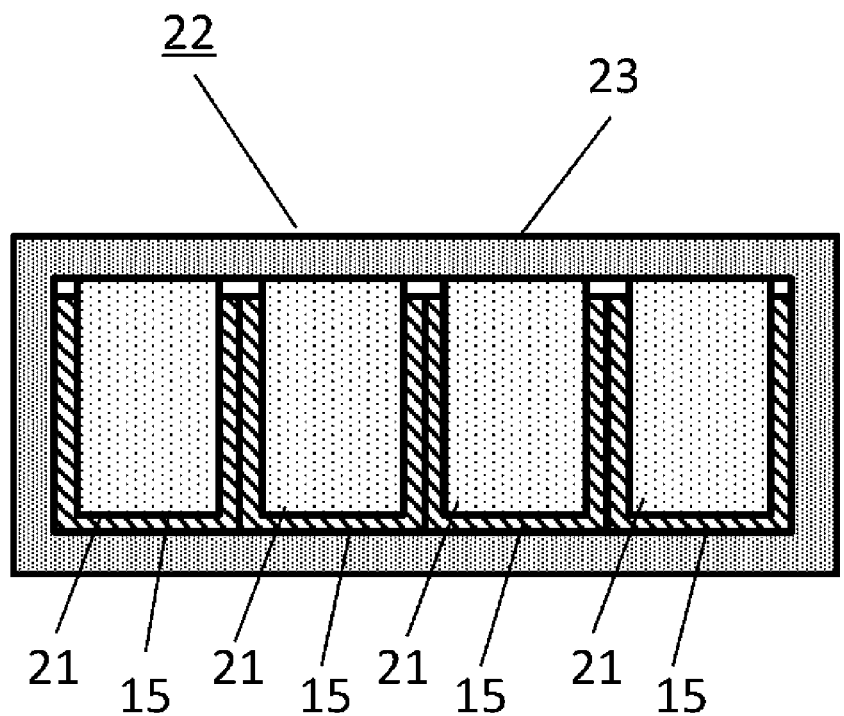
FIG. 13 is a schematic diagram of a battery pack according to the third exemplary embodiment of the present disclosure.

FIG. 11 is a perspective view of battery cell 21 as a secondary battery including thermal conduction sheet 15. FIG. 12 is a cross-sectional view of battery cell 21 in FIG. 11. The cross-sectional view is taken along a plane perpendicular to a main surface of thermal conduction sheet 15 including line XII-XII in FIG. 11. Line XII-XII in FIG. 11 is a line segment along a longitudinal direction of thermal conduction sheet 15. FIG. 13 is a schematic diagram of battery pack 22 including a plurality of battery cells 21 illustrated in FIG. 11.

Battery pack 22 includes housing 23 made of metal, and the plurality of battery cells 21 arranged in and fixed to housing 23. Each battery cell 21 has a width of approximately 150 mm, a height of approximately 100 mm, and a thickness of approximately 20 mm. Thermal conduction sheet 15 is attached to each of battery cells 21. Each battery cell 21 is a square lithium-ion battery and has, on its upper face, terminal electrodes 24. Thermal conduction sheet 15 is attached from one side face to a bottom face, and further to the other side face of a corresponding one of battery cells 21. The bottom face of each battery cell 21 is in contact with housing 23, with corresponding thermal conduction sheet 15 interposed between the bottom face and housing 23.

Thermal conduction sheet 15 includes graphite sheet 12, and insulating sheets 13 between and with which graphite sheet 12 is entirely sandwiched and sealed. Graphite sheet 12 has a plurality of cut-out portions 14 arranged linearly, and thermal conduction sheet 15 is bent at the portion where cut-out portions 14 are arranged. Thermal conduction sheet 15 is attached to corresponding battery cell 21 such that the portion at which thermal conduction sheet 15 is bent is aligned with a boundary (a corner) between each side face and the bottom face of battery cell 21. With this configuration, thermal conduction sheet 15 is easily bent at a region where cut-out portions 14 are formed, and is easily attached from each side face to the bottom face of battery cell 21. This configuration enables a reduction in temperature distribution in battery cell 21, and also enables a reduction in temperature of entire battery cell 21 by heat dissipation from the bottom face of battery cell 21 to housing 23.

In the first to third exemplary embodiments, thermal conduction sheet 11 or thermal conduction sheet 15 has a rectangular shape; however, the shape is not limited to the rectangular shape. Thermal conduction sheet 11 or thermal conduction sheet 15 may alternatively be formed in a polygonal shape such as a triangular shape or a hexagonal shape, a circular shape, an elliptical shape, or a sector shape in accordance with a shape of battery cell 21.

Further, the number of cut-out portions 14 in thermal conduction sheet 11 or thermal conduction sheet 15 may be one, or may be equal to or more than two. Each of cut-out portions 14 may be replaced with, for example, one-end closed recesses. The shape of thermal conduction sheet 11 or the thermal conduction sheet 15 at each cut-out portion 14 as seen in plan view is not limited to the rectangular shape and the shapes illustrated in FIGS. 6A to 6C, but may be a polygonal shape such as a triangular shape, a pentagonal shape, or a hexagonal shape, a circular shape, an elliptical shape, or a successive circular or elliptical shape.

Thermal conduction sheet 11 or thermal conduction sheet 15 according to the present disclosure may be formed in various sizes in addition to the sizes described in the foregoing exemplary embodiments.

Further, PET has been described as the material for each of insulating sheets 13. Alternatively, each of insulating sheets 13 may be made of a heat-resistant resin such as a polyimide resin, in addition to PET.

Insulating sheets 13 made of PET may be bonded together by thermo-compression.

In the second and third exemplary embodiments, battery cell 21 has been described as an example of a thermal generation unit. Alternatively, the thermal generation unit may be any element in addition to battery cell 21. For example, a thermal conduction sheet according to the present disclosure may be used for an IC chip incorporated in a smart phone. A thermal conduction sheet according to the present disclosure may also be used for a power module that is a thermal generation component.

Figure 14:
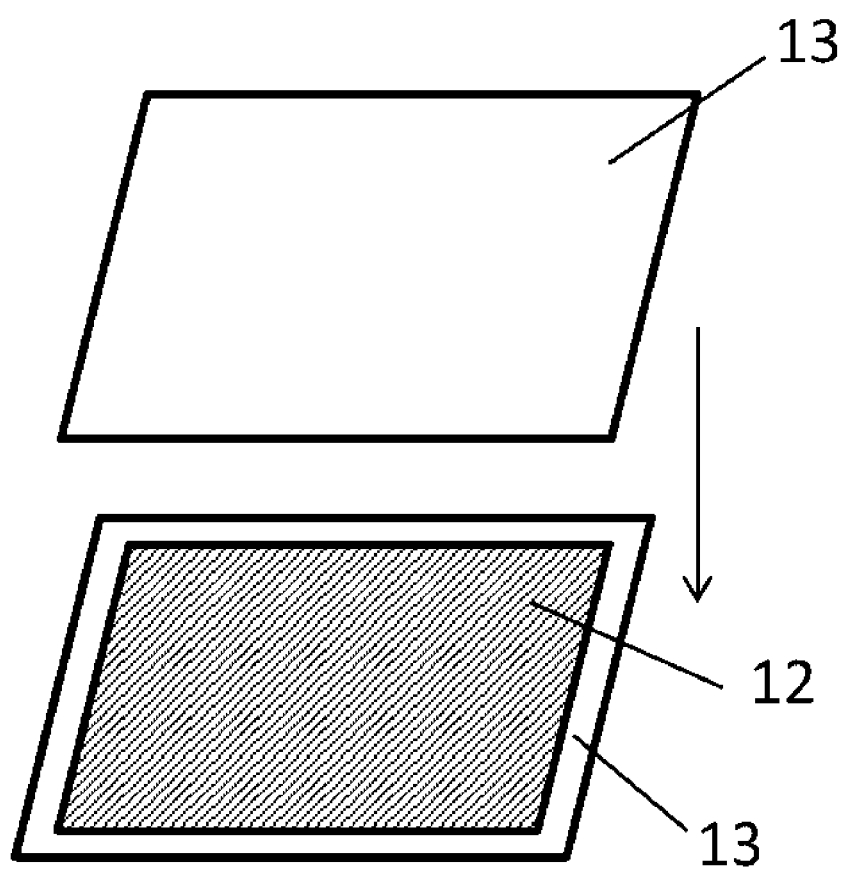
FIG. 14 shows one example of how to seal a graphite sheet according to the present disclosure.
Figure 15:
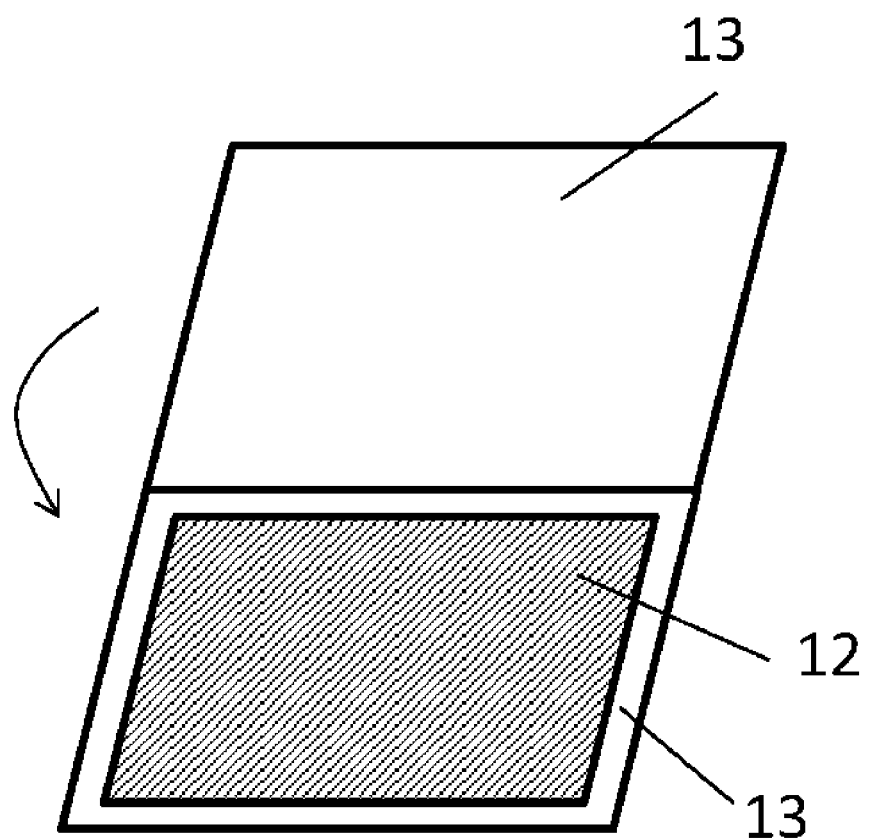
FIG. 15 shows another example of how to seal the graphite sheet according to the present disclosure.

Thermal conduction sheet 11 or 15 includes graphite sheet 12, and insulating sheets 13 between and with which graphite sheet 12 is sandwiched and sealed. For an example of how to seal graphite sheet 12, as illustrated in FIG. 14, graphite sheet 12 may be entirely sandwiched between two insulating sheets 13. For another example of how to seal graphite sheet 12, as illustrated in FIG. 15, a graphite sheet may be placed on a single large insulating sheet instead of two insulating sheets, and may be sandwiched between two folded layers of the insulating sheet that is folded along long sides or short sides of the graphite sheet.

With a thermal conduction sheet according the present disclosure and a battery pack including the thermal conduction sheet, even when a thermal conduction sheet includes a graphite sheet, and insulating sheets respectively attached to both faces of the graphite sheet, the thermal conduction sheet is easily attached from one face to the other face of a battery cell, the faces being perpendicular to each other. This configuration provides a battery pack with high reliability, which is industrially usable.

The invention claimed is:
1. A thermal conduction sheet comprising:
a graphite sheet; and
insulating sheets between and with which the graphite sheet is entirely sandwiched and sealed, wherein:
the graphite sheet includes a plurality of cut-out portions passing through the graphite sheet and arranged linearly,
the insulating sheets are continuously formed to cover the cut out portions,
a length of each of the cut-out portions in a first direction in which the cut-out portions are arranged is larger than a width of each of the cut-out portions in a second direction perpendicular to the first direction, and,
a relationship expressed by Mathematical Formula 1 is satisfied:

[Mathematical Formula 1]

$$0.5 \leq \frac{L}{L+S} \leq 0.9,$$

where L represents the length of each of the cut-out portions in the first direction, and S represents a length between adjoining two of the cut-out portions.

2. The thermal conduction sheet according to claim 1, wherein
the insulating sheets are bonded together inside the cut-out portions.

3. The thermal conduction sheet according to claim 1, wherein
a relationship expressed by Mathematical Formula 2 is satisfied:

$$2\cdot(T1+2\cdot T2) \leq W \leq 10\cdot(T1+2\cdot T2) \qquad \text{[Mathematical Formula 2]}$$

where W represents the width of each of the cut-out portions in the second direction, T1 represents a thickness of the graphite sheet, and T2 represents a thickness of each of the insulating sheets.

4. A secondary battery pack comprising:
a housing;
a plurality of secondary battery cells held in the housing; and
the thermal conduction sheet according to claim 1, wherein:
the thermal conduction sheet is bent on a portion where the plurality of cut-out portions are linearly arranged such that the plurality of cut-out portions are located at a corner of the bent thermal conduction sheet,
the thermal conduction sheet is attached from a side face to a bottom face of a corresponding one of the secondary battery cells, and
the thermal conduction sheet is disposed such that the portion at which the thermal conduction sheet is bent is aligned with a boundary between the side face and the bottom face of the corresponding secondary battery cell, and
a length of each of the cut-out portions in a first direction in which the cut-out portions are arranged is larger than a width of each of the cut-out portions in a second direction perpendicular to the first direction.

* * * * *